(12) United States Patent
Partridge

(10) Patent No.: US 10,283,936 B2
(45) Date of Patent: May 7, 2019

(54) QUANTUM CASCADE LASER WITH SERIALLY CONFIGURED GAIN SECTIONS

(71) Applicant: Agilent Technologies, Inc., Santa Clara, CA (US)

(72) Inventor: Guthrie Partridge, Santa Clara, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 204 days.

(21) Appl. No.: 14/814,426

(22) Filed: Jul. 30, 2015

(65) Prior Publication Data
US 2017/0033532 A1   Feb. 2, 2017

(51) Int. Cl.
*H01S 5/14* (2006.01)
*H01S 5/34* (2006.01)

(52) U.S. Cl.
CPC ............ *H01S 5/141* (2013.01); *H01S 5/3402* (2013.01)

(58) Field of Classification Search
CPC ...... H01S 5/141; H01S 5/3401–5/3402; H01S 5/5027; H01S 5/5045; H01S 5/06253; H01S 5/1092–5/1096
See application file for complete search history.

(56) References Cited

U.S. PATENT DOCUMENTS

| | | | | |
|---|---|---|---|---|
| 3,427,563 A * | 2/1969 | Lasher | ................ | G02F 3/026 327/199 |
| 4,622,671 A * | 11/1986 | Tsang | ................ | H01S 3/0826 372/19 |
| 4,680,769 A * | 7/1987 | Miller | ................ | H01S 5/02 372/19 |
| 5,396,508 A * | 3/1995 | Bour | ................ | B82Y 20/00 372/27 |
| 6,091,751 A * | 7/2000 | Berger | ................ | B82Y 20/00 372/45.01 |
| 6,104,739 A * | 8/2000 | Hong | ................ | H01S 5/06258 372/102 |
| 6,215,804 B1 * | 4/2001 | Sahlen | ................ | H01S 5/4031 372/26 |
| 6,625,192 B2 * | 9/2003 | Arbel | ................ | H01S 5/026 372/102 |
| 6,738,398 B2 * | 5/2004 | Hirata | ................ | H01S 5/06256 372/22 |
| 2008/0159341 A1 * | 7/2008 | Patel | ................ | B82Y 20/00 372/20 |
| 2010/0002734 A1 * | 1/2010 | Pushkarsky | ................ | H01S 5/141 372/20 |

* cited by examiner

*Primary Examiner* — Xinning (Tom) Niu
*Assistant Examiner* — Sean P Hagan

(57) ABSTRACT

An apparatus that includes a gain chip assembly, an external cavity, and a controller is disclosed. The gain chip assembly includes first and second gain chips that are coupled optically such that light travels serially between the first gain chip and the second gain chip, each gain chip is electrically biased. The electrical bias of the first gain chip is independent of the electrical bias of the second gain chip. The external cavity has a tunable wavelength selective filter that is changed in response to a control signal. Light in the external cavity passes through the gain chip assembly. The controller determines the tunable wavelength selective filter, and the electrical bias of each of the gain chips so as to cause the apparatus to lase at a wavelength specified by a control signal to the controller.

15 Claims, 5 Drawing Sheets

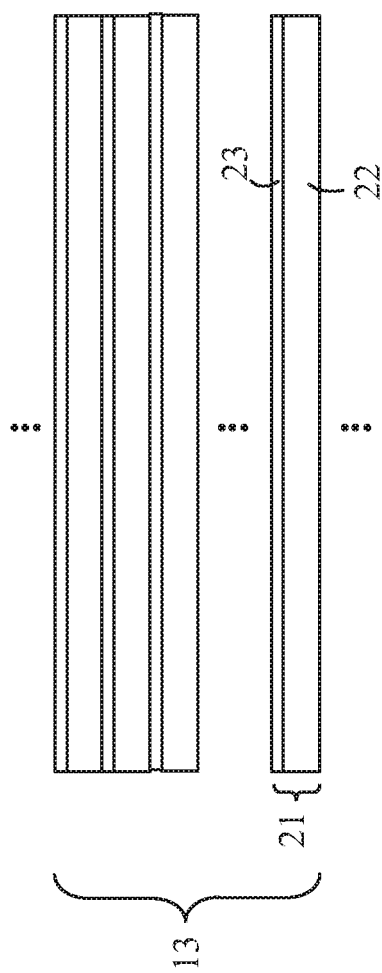

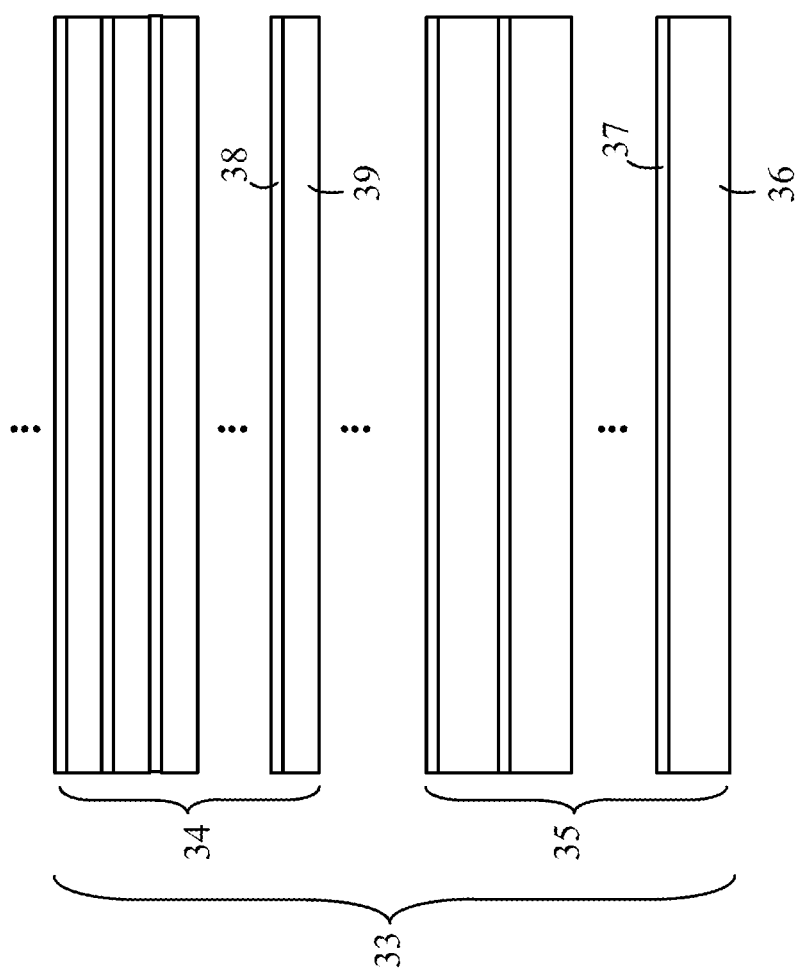

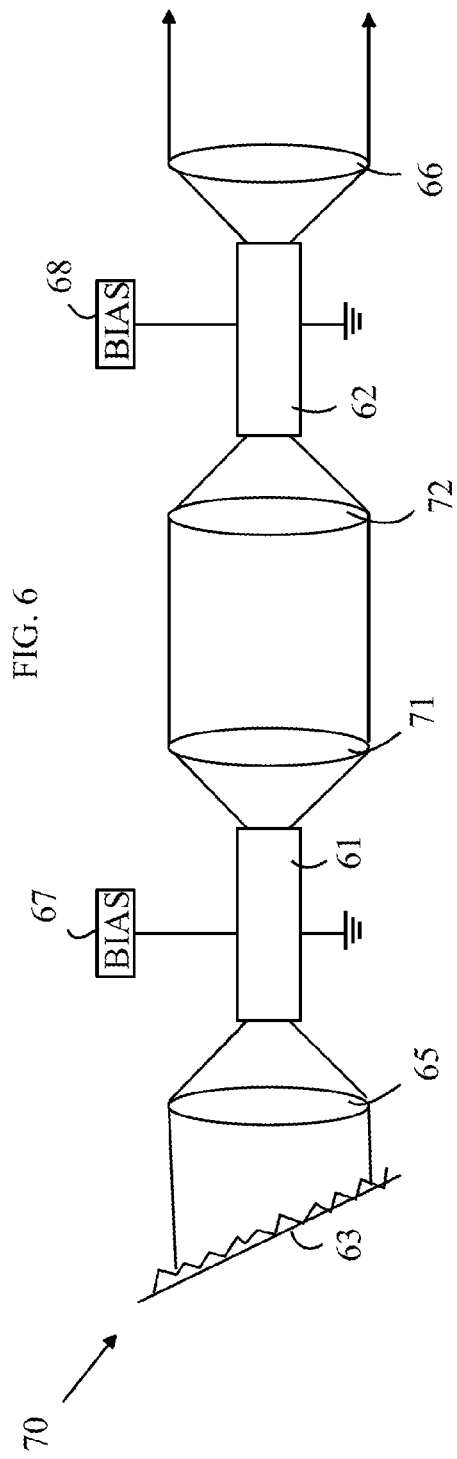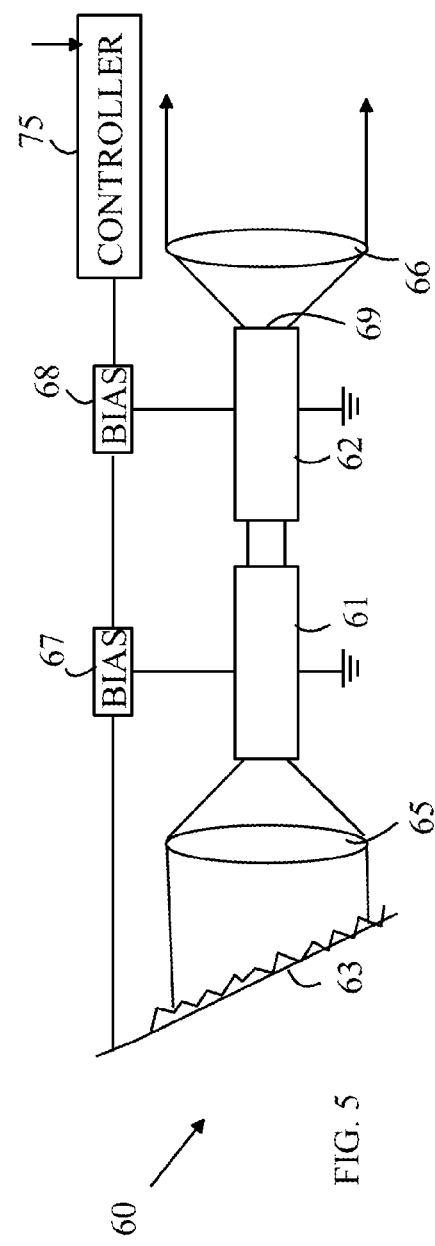

US 10,283,936 B2

QUANTUM CASCADE LASER WITH SERIALLY CONFIGURED GAIN SECTIONS

BACKGROUND

Imaging and spectrographic analysis in the mid- and long-wave infrared provide information about chemicals of interest in biologic and chemical settings. Quantum cascade lasers (QCLs) can be used as light sources for such measurements. QCLs can be tuned in wavelengths over a significant range of wavelengths in the infrared. However, the range of tuning could be productively increased.

SUMMARY

The present invention includes an apparatus that includes a gain chip assembly, an external cavity (EC), and a controller. The gain chip assembly includes first and second gain chips that are coupled optically such that light travels serially between the first gain chip and the second gain chip, each gain chip is electrically biased. The electrical bias of the first gain chip is independent of the electrical bias of the second gain chip. The EC has a tunable wavelength selective filter that is changed in response to a control signal, light in the EC passes through the gain chip assembly. The controller determines the tunable wavelength selective filter, and the electrical bias of each of the gain chips so as to cause the apparatus to lase at a wavelength specified by a control signal to the controller.

In one aspect of the invention, the first gain chip lases at wavelengths in a first band of wavelengths around a first wavelength, and the second gain chip lases at wavelengths in a second band of wavelengths around a second wavelength. The second gain chip is biased such that the second gain chip is transparent to wavelengths in the first band of wavelengths, but does not lase when the first gain chip is biased to lase at wavelengths in the first band of wavelengths.

In another aspect of the invention, the second gain chip also lases at wavelengths in a third band of wavelengths around a third wavelength and wherein the second gain chip is current biased such that the second gain chip does not lase when the first gain chip is biased to lase at wavelengths in the first band of wavelengths.

In another aspect of the invention, the second gain chip is biased to lase at a wavelength in the third band of wavelengths, and the first gain chip is biased such that the first gain chip is transparent to the wavelength in the third band of wavelengths, but the first gain chip does not lase, and the second gain chip does not lase at wavelengths in the first band of wavelengths.

In another aspect of the invention, the apparatus also includes an optical assembly that couples light leaving the first gain chip into the second gain chip.

In another aspect of the invention, one surface of the first gain chip is abutted to a corresponding surface in the second gain chip.

In another aspect of the invention, the apparatus includes a QCL.

In another aspect of the invention, the second gain chip is biased by a signal that is pulsed between first and second states, the first state causing the second gain chip to be transparent to light in the first band of wavelengths and the second state causing the second gain chip to be opaque to light in the second band of wavelengths.

In another aspect of the invention, the second gain chip is biased by a signal that varies between first and second states, both of the first and second states causing the second gain chip to be transparent to light in the second band of wavelengths without lasing. The first and second states are characterized by different optical path lengths through the second gain chip. The first and second states are chosen to partially compensate for changes in the first gain chip when the first gain chip is pulsed.

BRIEF DESCRIPTION OF THE DRAWINGS

FIG. 3 illustrates a more detailed view of active layer 13.

FIG. 4 illustrates a simplified cross-section of another prior art active region.

FIG. 5 illustrates an EC QCL according to one embodiment of the present invention.

FIG. 6 illustrates a laser that utilizes a pair of collimating lenses to allow the gain chips to be separated by a distance that would not be possible with the arrangement shown in FIG. 5.

DETAILED DESCRIPTION

Figure 1:
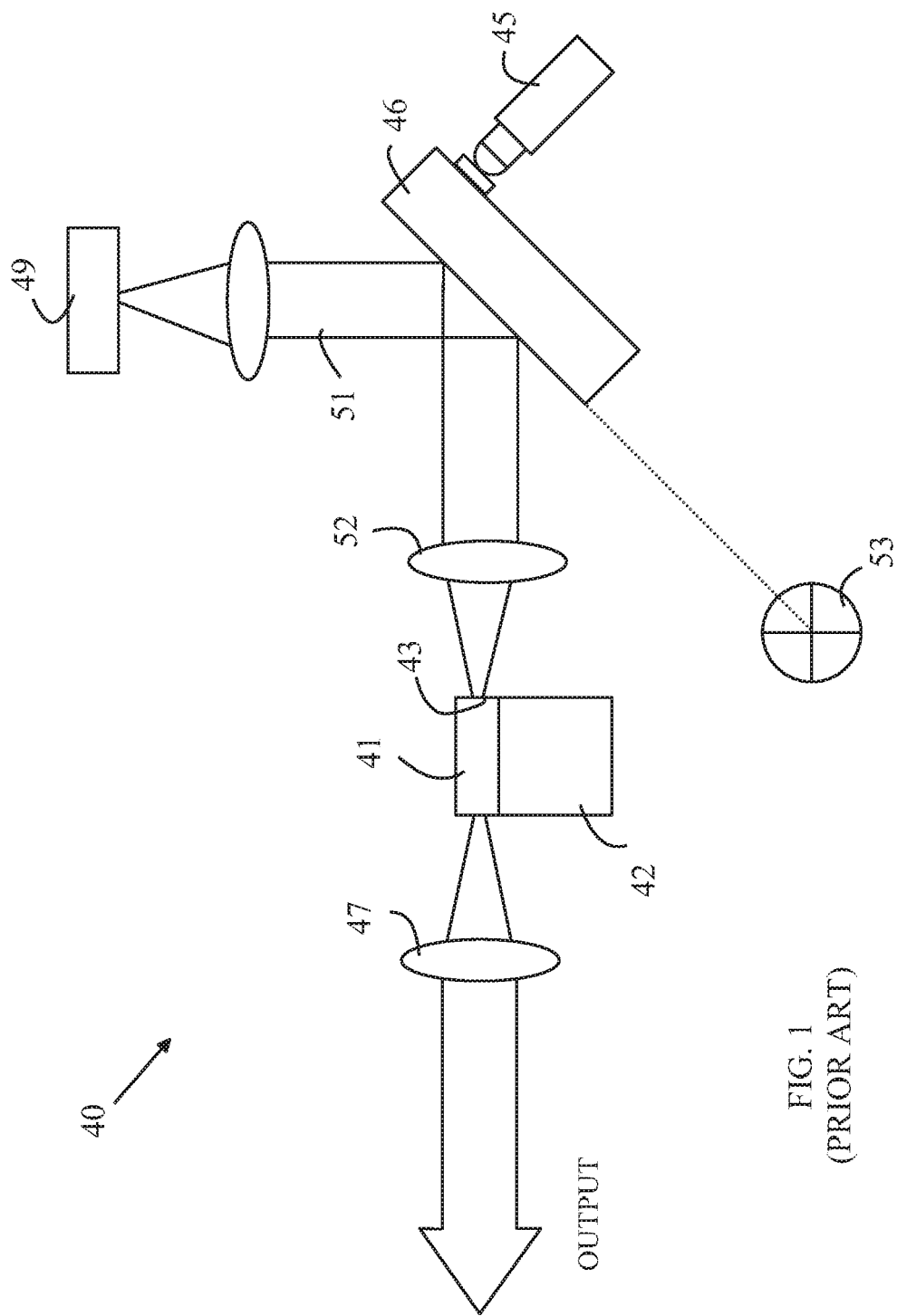
FIG. 1 illustrates a typical QCL with an EC for tuning the laser.

The manner in which the present invention provides its advantages can be more easily understood with reference to a QCL that uses an EC to tune the output wavelength. Refer now to FIG. 1, which illustrates a typical QCL with an EC for tuning the laser. Laser 40 includes a gain chip 41 that is mounted on a mount 42. Light emitted from the front facet 43 of gain chip 41 is reflected from a grating 46. The angle of grating 46 relative to the light beam from gain chip 41 is chosen to lock the laser on a particular mode. The angle is set by an actuator 45 that rotates the grating around an axis 53 that is chosen such that the diffracted wavelength and the length of the cavity are maintained to provide the desired wavelength. Lens 47 expands the output beam to the desired size to provide the output light that is used by the measurement system that utilizes laser 40 as its light source. Lens 52 expands the light leaving front facet 43 of gain chip 41 to a diameter that is set to provide the desired wavelength resolution from grating 46. Larger beam diameters relative to the spacing of the lines on grating 46 provide narrower wavelength bands in the reflected light that reaches gain chip 41.

In laser 40, an optional light output 51 is used to monitor the light intensity in the output beam using a photodetector 49. Photodetector 49 can be used to provide the signal indicating the output light intensity.

Figure 2:
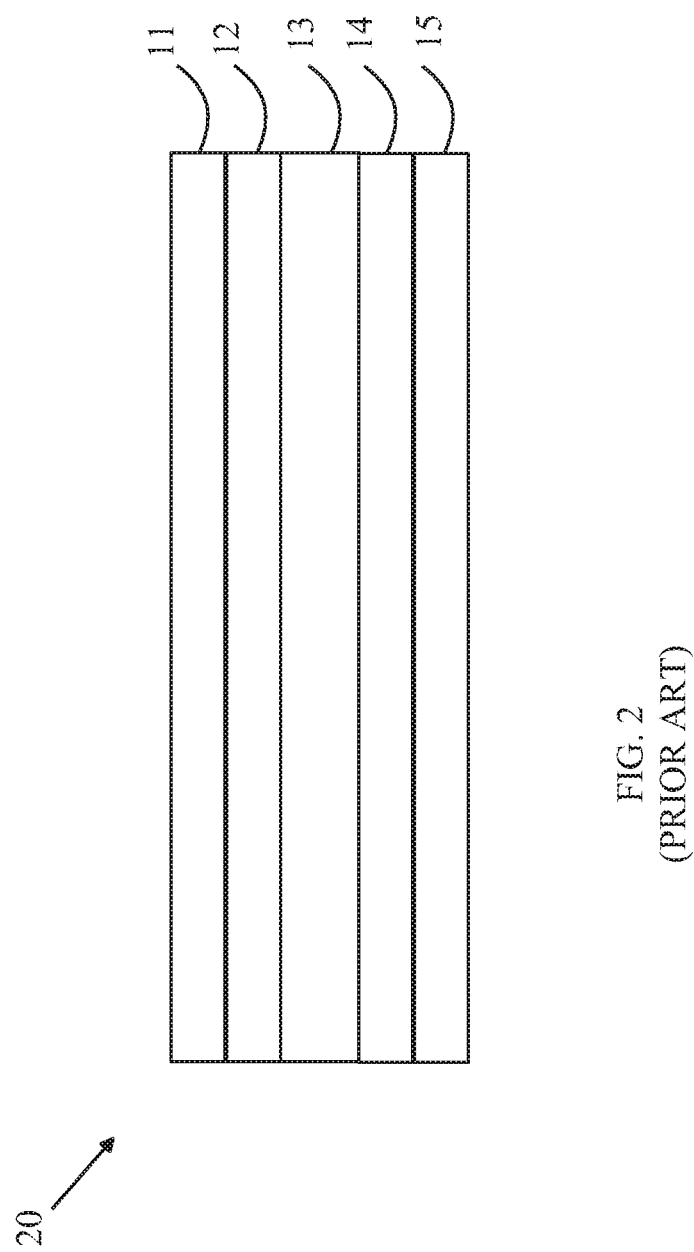
FIG. 2 is a cross-sectional view of one embodiment of a prior art gain chip that can be used in laser 40.

Refer now to FIG. 2, which is a cross-sectional view of one embodiment of a prior art gain chip that can be used in laser 40. For the purposes of this discussion, gain chip 20 has been reduced to the layers that are most relevant to the QCL operation. In particular, gain chip 20 includes an active layer 13 that will be discussed in more detail below. The active region is sandwiched between two wave guide regions 12 and 14. Wave guide region 14 is constructed on a substrate 15 that includes one power contact. A second power contact is provided to layer 11. It should be noted that the various layers may include a number of sub-layers which are not relevant to the present discussion but necessary for the gain chip to operate properly.

Refer now to FIG. 3, which is a more detailed view of active layer 13. The active layer is made up of a repeating two-layer unit 21. The first layer is an injection layer 23 for injecting electrons into the second layer 22, which is a quantum well layer composed of multiple sub-layers which form a series of repeating quantum wells which electrons may propagate (or "cascade") down under the influence of an applied electric field (voltage).

The wavelength of the photons emitted when the electrons cascade down the series of quantum wells created by the layers of the active region is determined by the thickness and distribution of the layers. For any single configuration of layers there is a band of wavelengths over which the chip may lase. The specific wavelength emitted by the laser within this band is determined by the external cavity described above. However, the available range of wavelengths for any single homogenous stack of layers is typically limited to tens of wave numbers in the mid-infrared. This is insufficient to provide the needed tuning range for many applications.

Refer now to FIG. 4. which is a simplified cross-section of another prior art active region. One method for increasing the breadth of the gain profile is to use an active layer 33 that has multiple sub-stacks such as sub-stacks 34 and 35. Each sub-stack has quantum well layers of the same design; however, the quantum well layers 39 in sub-stack 34 have a different design than the quantum well layers 36 in sub-stack 35. The injection layers 37 and 38 may or may not have the same design, depending on the particular system. When one sub-stack does not provide sufficient gain at a desired wavelength, the other sub-stack may take over. This technique can be used to expand the useful bandwidth of a single gain chip to hundreds of wave numbers. The design of such heterogeneous QCLs is ultimately constrained by the compatibility of optical, mechanical and electronic characteristics of the constituent sub-stacks.

Even if these constraints are satisfied, broadband operation with an EC for tuning presents challenges. For example, after lasing begins at the wavelength set by the grating and EC, the sub-stack with the highest initial gain contribution at the chosen wavelength may cease to increase in gain with continued increases in electrical current (due to the reduction of its population inversion from stimulated emission). At the same time, the off resonant sub-stacks continue to increase their gain contribution as the current increases. Eventually one of the other sub-stacks will exceed the gain threshold for solitary Fabry Perot (FP) mode lasing and lase near the peak of its own gain curve, resulting in multimode operation and the associated instabilities.

This problem is connected to the requirement that the sub-stacks are connected in series electrically. Hence, increasing the current to one sub-stack to increase the output of that sub-stack results in all of the sub-stacks receiving an increased current. There is a limit to the current that can be run through a sub-stack before that sub-stack has sufficient gain to lase on its own using the facets of the gain chip as its cavity. At this point, the wavelength of the QCL is no longer responsive to the EC, and the QCL wavelength cannot be tuned. If the corresponding threshold current is below the current needed to provide the desired gain for another sub-stack in the QCL, setting the gain for the desired sub-stack presents challenges.

The manner in which the present invention provides its advantages can be more easily understood with reference to FIG. 5, which illustrates an EC QCL according to one embodiment of the present invention. EC QCL 60 includes two gain chips shown at 61 and 62. Each gain chip has its own current supply, the current supplies for gain chips 61 and 62 being shown at 67 and 68, respectively. The current supplies are operated independently as described below. The laser cavity is defined by grating 63 and the front facet 69 of gain chip 62. Collimating lens 65 expands the light leaving gain chip 61 to provide a wider area of coverage on grating 63 to increase the resolution of the wavelength that is reflected back into gain chip 61. Collimating lens 66 sets the diameter of the output laser beam. The light from gain chip 61 is coupled into gain chip 62 and vice versa by placing the ends of the gain chips sufficiently close together. The current supplies and position of grating 63 are controlled by controller 75 which responds to an input signal specifying the desired wavelength to be generated.

To simplify the following discussion, it will be assumed that gain chip 61 has one homogenous active region and gain chip 62 has one homogenous active region with quantum wells of different design than those in gain chip 61. The case in which one or both of the gain chips each contain sub-stacks with different quantum well sizes will be discussed in more detail below. For the purpose of this discussion, it will be assumed that gain chip 61 lases in a band of wavelengths around $\lambda_1$, and gain chip 62 lases in a band of wavelengths around 20. When operating at wavelengths around $\lambda_1$, gain chip 61 must be current biased to provide the necessary gain at those wavelengths, while gain chip 62 must be current biased such that gain chip 62 is transparent to light in the band of wavelengths around $\lambda_1$, but with insufficient gain to cause gain chip 62 to lase at one of its wavelengths around $\lambda_2$.

The present invention is based on the observation that the transparency of a gain chip for a QCL is a function of the bias current through the chip. At low bias currents, gain chip 62 may be too opaque to pass sufficient light to allow the gain of gain chip 61 to compensate for the losses, and hence, EC QCL 60 will not operate. As the bias current through gain chip 62 is increased, the transparency of gain chip 62 may increase to a point near unity without causing gain chip 62 to lase in its band of wavelengths around $\lambda_2$. If the bias current through gain chip 62 is increased further, gain chip 62 will eventually start to lase at one of its wavelengths. Hence, the bias currents are set such that gain chip 61 has sufficient current to lase at the desired wavelength and gain chip 62 is transparent, but non-lasing. Similarly, if EC QCL 60 is to be operated at one of the wavelengths of gain chip 62, the bias current through gain chip 61 is set to increase the transparency of gain chip 61 to a value that will allow any losses to be made up by gain chip 62. The gain of gain chip 62 is set such that gain chip 62 lases at the desired wavelength in the band of wavelengths around $\lambda_2$.

The above-described embodiments rely on coupling light between gain chips 61 and 62 based on the proximity of the two gain chips to each other. If the losses in this configuration are too large, or the chips must be moved farther apart, a pair of collimating lens can be introduced to provide the coupling. Refer now to FIG. 6, which illustrates a laser that utilizes a pair of collimating lenses to allow the gain chips to be separated by a distance that would not be possible with the arrangement shown in FIG. 5. To simplify the following discussion, those elements of laser 70 that serve functions analogous to elements in EC QCL 60 have been given the same numerical designations and will not be discussed further here. Laser 70 differs from EC QCL 60 in that gain chips 61 and 62 have been separated in space. A pair of collimating lenses shown at 71 and 72 images the output of each gain chip into the input of the other gain chip.

In the above-described embodiments, two gain chips were utilized with each gain chip having a single homogenous quantum well stack in the active region. However, lasers with more gain chips could be utilized. The maximum number of gain chips depends on the degree to which the non-lasing gain chips can be set to have transparencies that are close enough to unity that the lasing gain chip can compensate for the remaining losses.

The individual gain chips could also have a limited number of sub-stacks having different quantum well design wavelengths. The problems with multiple sub-stacks that are electrically driven in series becomes significantly worse as the number of sub-stacks (and the width of the resulting composite gain envelope) increases. In addition, prior art arrangements with one gain chip having multiple sub-stacks require that a sub-stack be present for each band of wavelengths in which the laser is required to operate. If two sub-stacks are incompatible, because the desired wavelength sub-stack requires a current that excites one of the other sub-stacks to lase, the problem sub-stack cannot merely be removed, as this would lead to a region in which the EC laser could not be tuned.

The present invention overcomes this problem by reducing the number of sub-stacks that must be placed in a single gain chip and by allowing incompatible sub-stacks to be placed in separate gain chips where the incompatibility is less of a problem. Since only the combination of the multiple gain chips needs to have a sub-stack or stack that covers each of the desired wavelength regions, a problematic sub-stack can be placed in its own separate gain chip or in a gain chip with other sub-stacks that do not excite the problem sub-stack when the other sub-stacks are being driven to lase in their desired frequency bands.

In the above-described embodiments, the inactive gain chip is biased to allow that gain chip to pass the light from the active gain chip without having sufficient gain to lase. As noted above, the inactive gain chip when unbiased, is sufficiently opaque to prevent the lasing based on the active gain chip. In principle, the inactive gain chip can provide a gating function by switching from the unbiased mode to the biased mode.

The active gain chip can be run in either a continuous mode or a pulsed mode. Similarly, the inactive gain chip can be operated in a continuous or pulsed mode. In the pulsed mode, the output of the active gain chip varies in frequency slightly due to the large bias current that is suddenly applied to the active gain chip. This frequency shift is known as a "chirp" in the laser output. The chirp is the result of a change in the index of refraction due to thermal and charge carrier density effects as well as modifications to the physical size of the active gain chip material (thermal expansion). These changes, in turn, lead to a change in the effective optical path length of the external cavity that contains the active gain chip.

In one aspect of the invention, the inactive gain chip is used to partially compensate for the change in optical path length. As noted above, the inactive gain chip must be operated at a current above a minimum current that is needed to maintain the transparency of the inactive gain chip to the laser light generated in the active gain chip. In addition, the bias current is preferably less than the bias current that would cause the inactive gain chip to lase. Between these two limits, the bias current can be adjusted. For example, if the inactive gain chip is biased toward the high limit when the active gain chip is pulsed, and then the bias is reduced to the lower limit during the pulse period. The change in optical path length introduced by the switching and subsequent heating of the active gain chip can be partially compensated by the change in optical path length introduced by the switching and subsequent cooling of the inactive gain chip corresponding to the reduction in the current flowing through the inactive gain chip.

The inactive gain chip can also be used to gate the signal from the active gain chip when the active gain chip is run in either the continuous or pulsed mode by switching the bias current from a value that provides transparency to a value that is below the transparency threshold. Hence, the laser can be operated in pulsed mode by pulsing either the active or inactive gain chips. If both gain chips are operated in pulsed mode with pulses that only partially overlap, the resulting laser pulse can be much shorter than either of the pulses applied to the gain chips.

In the above-described embodiments, the non-selected gain chip is biased such that the non-selected gain chip does not lase and the non-selected gain chip is transparent. For the purposes of this discussion, a gain chip will be defined to be transparent to light of a particular wavelength if the fraction of the light that is absorbed by that gain chip when light of that wavelength passes through that gain chip is less than some predetermined value that depends on the gain of the gain chip that is lasing at that wavelength. If the lasing gain chip can make up for the loses in the non-lasing gain chip, the non-lasing gain chip is defined to be transparent at the lasing wavelength. It should be noted that the non-lasing gain chip could be less transparent at other wavelengths without interfering with the operation of the EC laser.

The above-described embodiments use a diffraction grating to form one wall of the external cavity and to also filter the wavelengths that are reflected within the cavity to increase the selectivity of the wavelength of the mode that is lasing. In principle, other structures could be used to selectively filter the wavelengths at which lasing takes place. The present invention does not require any specific external cavity arrangement.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
a gain chip assembly comprising first and second gain chips that are coupled optically such that light travels serially between said first gain chip and said second gain chip, each gain chip being electrically biased, said electrical bias of said first gain chip being independent of said electrical bias of said second gain chip;
an external cavity having a tunable wavelength selective filter that selectively passes light in a pass band that is changed in response to a control signal, light in said external cavity passing through said gain chip assembly; and
a controller that generates said control signal, and said electrical bias of each of said gain,
wherein said first gain chip comprises an active layer comprising a first sub-layer having a plurality of quantum well layers characterized by a first quantum well thickness, said second gain chip comprises an active layer having second and third sub-layers, said second sub-layer comprising a plurality of quantum well layers characterized by a second quantum well thickness, and said third sub-layer comprising a plurality of quantum well layers characterized by a third quantum well thickness, said second and third sub-layers being connected in series to said electrical bias of said second gain chip, said first, second, and third quantum well thicknesses being different from one another, and wherein said first, second and third quantum well thicknesses are chosen such that only one of said first, second, and third sub-layers supports lasing at any given electrical biases of said first and second gain chips, whereas a single gain chip having an active layer with said three sub-layers would support simultaneous lasing by two of said first, second, and third sub-layers.

2. The apparatus of claim 1 wherein said second gain chip is biased such that said second gain chip is transparent to light generated when said first gain chip lases, but does not lase when said first gain chip is biased to lase.

3. The apparatus of claim 1 wherein said first gain chip is biased such that said first gain chip is transparent to light generated when said second gain chip lases, but said first gain chip does not lase when said second gain chip lases.

4. The apparatus of claim 1 further comprising an optical assembly between said first and second gain chips that couples light leaving said first gain chip into said second gain chip.

5. The apparatus of claim 1 wherein one surface of said first gain chip is abutted to a corresponding surface in said second gain chip.

6. The apparatus of claim 1 wherein said apparatus comprises a quantum cascade laser.

7. The apparatus of claim 2 wherein said second gain chip is biased by a signal that is pulsed between first and second states, said first state causing said second gain chip to be transparent to light generated by said first gain chip and said second state causing said second gain chip to be opaque to light generated by said first gain chip.

8. The apparatus of claim 2 wherein said second gain chip is biased by a signal that varies between first and second states, both of said first and second states causing said second gain chip to be transparent to light generated by said first gain chip without lasing, said first and second states being characterized by different optical path lengths through said second gain chip, said first and second states being chosen to partially compensate for changes in said first gain chip when said first gain chip is pulsed.

9. A method for increasing the bandwidth of a QCL over which the output wavelength can be tuned, said QCL having a first gain chip characterized by a first bandwidth over which the output can be tuned, and an external cavity, said method comprising:

providing a gain chip to form a gain chip assembly comprising said first gain chip and a second gain chip that are coupled optically such that light travels serially between said first gain chip and said second gain chip, each gain chip being electrically biased, said electrical bias of said first gain chip being independent of said electrical bias of said second gain chip; and controlling said electrical biases of said first and second gain chips such that one of said first and second gain chips is lasing and the other of said first and second gain chips is transparent to light generated by said one of said gain chips wherein said first gain chip comprises an active layer comprising a first sub-layer having a plurality of quantum well layers characterized by a first quantum well thickness, said second gain chip comprises an active layer having second and third sub-layers, said second sub-layer comprising a plurality of quantum well layers characterized by a second quantum well thickness, and said third sub-layer comprising a plurality of quantum well layers characterized by a third quantum well thickness, said second and third sub-layers being connected in series to said electrical bias of said second gain chip, said first, second, and third quantum well thicknesses being different from one another, and wherein said first, second and third quantum well thicknesses are chosen such that only one of said first, second, and third sub-layers supports lasing at any given electrical biases of said first and second gain chips, whereas a single gain chip having an active layer with said three sub-layers would support simultaneous lasing by two of said first, second, and third sub-layers.

10. The method of claim 9 wherein said second gain chip is biased such that said second gain chip is transparent to light generated when said first gain chip lases, but does not lase when said first gain chip is biased to lase.

11. The method of claim 9 wherein said first gain chip is biased such that said first gain chip is transparent to light generated when said second gain chip lases, but said first gain chip does not lase when said second gain chip lases.

12. The method of claim 9 further comprising coupling light leaving said first gain chip into said second gain chip via an optical assembly located between said first and second gain chips.

13. The method of claim 9 wherein one surface of said first gain chip is abutted to a corresponding surface in said second gain chip.

14. The method of claim 10 wherein said second gain chip is biased by a signal that varies between first and second states, both of said first and second states causing said second gain chip to be transparent to light generated by said first gain chip without lasing, said first and second states being characterized by different optical path lengths through said second gain chip, said first and second states being chosen to partially compensate for changes in said first gain chip when said first gain chip is pulsed.

15. The method of claim 10 wherein said second gain chip is biased by a signal that is pulsed between first and second states, said first state causing said second gain chip to be transparent to light in said first band of wavelengths and said second state causing said second gain chip to be opaque to light in said first band of wavelengths.

* * * * *

UNITED STATES PATENT AND TRADEMARK OFFICE
CERTIFICATE OF CORRECTION

PATENT NO. : 10,283,936 B2
APPLICATION NO. : 14/814426
DATED : May 7, 2019
INVENTOR(S) : Guthrie Partridge It is certified that error appears in the above-identified patent and that said Letters Patent is hereby corrected as shown below:

In the Specification

Column 1, Line 50, delete "first" and insert -- second --, therefor.

Column 1, Line 65, delete "second" and insert -- first --, therefor.

Column 4, Line 21, delete "20." and insert -- $\lambda_2$. --, therefor.

Signed and Sealed this
Fifteenth Day of October, 2019

Andrei Iancu
*Director of the United States Patent and Trademark Office*